United States Patent
Byun et al.

(10) Patent No.: US 7,123,407 B2
(45) Date of Patent: Oct. 17, 2006

(54) APPARATUS AND METHOD FOR REALIZING ALL-OPTICAL NOR LOGIC DEVICE USING GAIN SATURATION CHARACTERISTICS OF A SEMICONDUCTOR OPTICAL AMPLIFIER

(75) Inventors: Young Tae Byun, guri-si (KR); Jae Hun Kim, Seoul (KR); Young Min Jhon, Seoul (KR); Seok Lee, Seoul (KR); Deok Ha Woo, Seoul (KR); Sun Ho Kim, Seoul (KR); Jong Chang Yi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 86 days.

(21) Appl. No.: 11/039,692

(22) Filed: Jan. 20, 2005

(65) Prior Publication Data

US 2006/0158716 A1   Jul. 20, 2006

(51) Int. Cl.
*G02F 3/00* (2006.01)
(52) U.S. Cl. ................. 359/344; 359/108
(58) Field of Classification Search ........... 359/344, 359/108, 107
See application file for complete search history.

(56) References Cited

U.S. PATENT DOCUMENTS

| | | | | |
|---|---|---|---|---|
| 4,932,739 | A * | 6/1990 | Islam | 359/108 |
| 4,999,688 | A * | 3/1991 | Hara et al. | 307/117 |
| 5,020,050 | A * | 5/1991 | Islam | 359/108 |
| 5,537,243 | A * | 7/1996 | Fatehi et al. | 359/341.1 |
| 5,704,015 | A * | 12/1997 | Ono | 706/40 |
| 5,999,283 | A * | 12/1999 | Roberts et al. | 359/108 |

(Continued)

OTHER PUBLICATIONS

Ali Hamié, Ammar Sharaiha, Mikael Guégan, and Benoît Pucel. All-Optical Logic NOR Gate Using Two-Cascaded Semiconductor Optical Amplifiers. IEEE Photonics Technology Letters, vol. 14, No. 10, Oct. 2002. pp. 1439-1441.*

(Continued)

*Primary Examiner*—Jack Keith
*Assistant Examiner*—Ari M Diacou
(74) *Attorney, Agent, or Firm*—Harness, Dickey & Pierce, PLC

(57) ABSTRACT

The present invention relates to an apparatus and a method for realizing all-optical NOR logic device using the gain saturation characteristics of a semiconductor optical amplifier(SOA). More particularly, the invention relates to a 10 Gbit/s all-optical NOR logic device among all-optical logic devices, in which a signal transmitted from a given point of an optical circuit such as an optical computing circuit is used as a pump signal and a probe signal.

The method for realizing an all-optical NOR logic device using the gain saturation characteristics of the SOA according to the present invention comprises the steps of: utilizing A+B signal which couples together an input signal pattern A (1100) and an input signal pattern B (0110) as a pump signal (1110); utilizing a probe signal (1111) by generating a clock signal out of said input signal pattern A (1100); and obtaining a Boolean equation $\overline{A+B}$ by making said probe signal and said pump signal incident upon the SOA simultaneously from the opposite direction.

The all-optical logic device according to the present invention has a simple construction since it is realized through the XGM (Cross Gain Modulation) method which utilizes the gain saturation characteristics. Also, it is expected that the method employed in the present invention could be used for realizing other all-optical logic circuits and devices.

14 Claims, 4 Drawing Sheets

U.S. PATENT DOCUMENTS

| | | | | |
|---|---|---|---|---|
| 5,999,284 | A * | 12/1999 | Roberts | 359/108 |
| 6,128,110 | A * | 10/2000 | Bulow | 359/108 |
| 6,219,160 | B1 * | 4/2001 | Nordal et al. | 359/107 |
| 6,424,438 | B1 * | 7/2002 | Byun et al. | 359/108 |
| 6,462,865 | B1 * | 10/2002 | Chu et al. | 359/344 |
| 6,522,462 | B1 * | 2/2003 | Chu et al. | 359/344 |
| 6,624,929 | B1 * | 9/2003 | Kim et al. | 359/344 |
| 6,647,163 | B1 * | 11/2003 | Song | 385/15 |
| 6,778,303 | B1 * | 8/2004 | Song | 359/108 |
| 6,801,349 | B1 * | 10/2004 | Kim et al. | 359/108 |
| 6,804,047 | B1 * | 10/2004 | Byun et al. | 359/344 |
| 6,822,591 | B1 * | 11/2004 | Kim et al. | 341/137 |
| 6,853,658 | B1 * | 2/2005 | DiJaili et al. | 372/38.1 |
| 6,930,826 | B1 * | 8/2005 | Kim et al. | 359/344 |
| 6,943,925 | B1 * | 9/2005 | Islam | 359/108 |
| 6,952,172 | B1 * | 10/2005 | Bhardwaj et al. | 341/13 |
| 6,987,607 | B1 * | 1/2006 | Watanabe | 359/332 |
| 6,990,281 | B1 * | 1/2006 | Shahar et al. | 385/122 |
| 7,053,359 | B1 * | 5/2006 | Ponomarenko | 250/227.19 |
| 2002/0001112 | A1 * | 1/2002 | Song | 359/107 |
| 2002/0154350 | A1 * | 10/2002 | Johnson et al. | 359/108 |
| 2003/0002797 | A1 * | 1/2003 | Chu et al. | 385/39 |
| 2003/0058527 | A1 * | 3/2003 | Kim et al. | 359/344 |
| 2003/0058528 | A1 * | 3/2003 | Byun et al. | 359/344 |
| 2003/0090784 | A1 * | 5/2003 | Kim et al. | 359/344 |
| 2004/0125426 | A1 * | 7/2004 | McAulay | 359/108 |
| 2004/0174600 | A1 * | 9/2004 | Westphal | 359/495 |
| 2006/0092501 | A1 * | 5/2006 | Byun et al. | 359/333 |

OTHER PUBLICATIONS

A. Sharaiha, H.W. Li, F. Marchese and J. Le Bihan. All-optical logic NOR gate using a semiconductor laser amplifier. Electronics Letters Feb. 13, 1997 vol. 33 No. 4. pp. 323-325.*

* cited by examiner

| A | B | NOR |
|---|---|-----|
| 0 | 0 | · |
| 0 | · | 0 |
| 1 | 0 | 0 |
| 1 | · | 0 |

APPARATUS AND METHOD FOR REALIZING ALL-OPTICAL NOR LOGIC DEVICE USING GAIN SATURATION CHARACTERISTICS OF A SEMICONDUCTOR OPTICAL AMPLIFIER

BACKGROUND OF THE INVENTION

The present invention relates to an apparatus and a method for realizing an all-optical NOR logic device using the gain saturation characteristics of a semiconductor optical amplifier SOA. More particularly, the invention relates to a 10 Gbit/s all-optical NOR logic device among all-optical logic devices, in which a signal transmitted from a given point of an optical circuit such as an optical computing circuit is used as a pump signal and a probe signal.

The recent trends show that the requirement for a high capacity and a high speed system is exponentially increasing.

Most of the present systems are based on silicon materials which operate on the basis of electric signals. For this reason, their future reliability is somewhat uncertain since they are expected to face a serious limitation in terms of their speed and the quantity of information that can be processed.

On the contrary, the systems utilizing the optical devices which are based on Indium Phosphide (InP) are expected to easily overcome all aspects of the aforementioned problems including the speed and quantity of information that can be processed by the systems.

When a system is being configured in general, the method which is based on integrating the single logic devices (AND, OR, XOR, NAND, NOR, NXOR) is utilized. This is also true in case of configuring an optical system.

The logic devices which have two stable states known as logic 0 and 1 are the basic building blocks of a digital computer.

Computers codify all the information using the two logic states. Accordingly, it is certain that logic devices will play a significant role in the development of all-optical logic devices and optoelectronic devices for the future information technology.

Up to the present, all-optical logic devices for ultra-high speed optical information processing utilize either the non-linear characteristics or wavelength conversion characteristics of light.

Especially, implementations of all-optical NOR logic devices using the nonlinear gain of the SOA are listed chronologically as below;

(1) NOR based on a single-arm ultra-fast nonlinear interferometer (N. S. Patel, et al., Opt. Lett., 21, 1446 (1996))
(2) All-optical NOR implemented by two pump signals with the same wavelength (A. Sharaiha, H. W. L I, F. Matchese and J. Le Bihan, Electron. Lett., 33, 323(1997))
(3) All-optical NOR implemented by two pump signals with two different wavelengths (Young Tae Byun, Sang Hyuck Kim, Deok Ha Woo, Seok Lee, Dong Hwan Kim and Sun Ho Kim, New Physics, 40, 560(2000)), Apparatus and method for realizing All-optical NOR logic device (Young Tae Byun, Sang Hyuck Kim, Deok Ha Woo, Seok Lee, Dong Hwan Kim and Sun Ho Kim, U.S. Pat. No. 6,424,438 B1, Date of patent: Jul. 23, 2002)
(4) All-optical NOR implemented by connecting two semiconductor optical amplifiers (Ali Hamie, Ammar Sharaiha, Mikael Guegan and Benoit Pucel, IEEE Photon. Technol. Lett., 14, 1439 (2002)).

All-optical NOR logic devices that utilizes an ultra-fast nonlinear interferometer (UNI) as shown in (1) has an advantage of being able to operate at high speed.

However, it is unsuitable for an application in optical operating systems which require a high degree of integration. Also, their essential components consist of complicated optical fiber devices whose integration with other devices are also difficult.

On the contrary, all-optical logic devices which utilize the SOA are stable and small in size. They also have the advantages of being easily integrated with other optical devices and are independent of polarization and wavelength (T. Fjeld, D. Wolfson, A. kloch, B. Dagens, A. Coquelin, I. Guillemot, F. Gaborit, F. Poingt and M. Renaud, Electron. Lett., 36, 1863(2000)).

However, if only the nonlinear characteristic of single SOA is utilized without the optical fiber interferometer, then the structure of an all-optical logic NOR becomes simple and the integration with other devices is possible. However, its operating speed is less than 100 MHz.

In addition, an all-optical NOR logic device implemented by connecting two SOAs as listed in (4) has a better on/off ratio in a wide wavelength region in comparison to an all-optical NOR logic device that utilizes single SOA. However, its operating speed becomes below 62.5 MHz.

More specifically, in the conventional all-optical NOR logic devices as listed in (2) to (4), which do not use the optical fiber interferometer, a pump signal is None-Return to Zero (NRZ) pattern by using a square wave. In addition, a laser beam of continuous wave (CW) light is utilized as a probe signal.

In this case, the operating speed of the all-optical NOR logic devices is constrained to below 100 MHz due to the NRZ pattern of the pump signal and the CW light of the probe signal.

Accordingly, it is imperative to develop an all-optical NOR logic device which is not only possible to be integrated with other optical devices but also has a simple structure and an improved operating speed more than 10 GHz.

SUMMARY OF THE INVENTION

The present invention is designed to overcome the above problems of the prior art mentioned above.

The object of the present invention is to provide a 10 Gbit/s all-optical NOR logic device using the gain saturation characteristics of a semiconductor optical amplifier (SOA).

In order to achieve the aforementioned objects, the present invention provides a method of implementing an all-optical NOR logic device using the gain saturation characteristics of the SOA which comprises the steps of utilizing A+B signal which couples together an input signal pattern A (1100) and an input signal pattern B (0110) as a pump signal (1110); utilizing a probe signal (1111) by generating a clock signal out of said input signal pattern A (1100); and obtaining a Boolean equation $\overline{A+B}$ by making said probe signal and said pump signal incident upon the SOA simultaneously from the opposite direction.

In order to achieve the aforementioned objects, the present invention provides an apparatus for realizing an all-optical NOR logic device using the gain saturation characteristics of the SOA which comprises: a pump signal generating means which generates a coupled input signal A+B to be used as a pump signal (1110) through a coupling of an input signal pattern A (1100) and an input signal pattern B (0110); a probe signal generating means which generates a clock signal out of said input signal pattern A (1100) to be used as a probe signal (1111); and a NOR generating means which obtains a Boolean equation $\overline{A+B}$ by making said probe signal and pump signal incident upon the SOA simultaneously from the opposite direction.

DESCRIPTION OF THE NUMERIC ON THE MAIN PARTS OF THE DRAWINGS

ATTN1, ATTN2, ATTN3: Attenuator
EDFA: Er-doped fiber amplifier
ISO: Isolator
OTDM MUX: Optical Time Division Multiplexer
OSC: Oscilloscope
PD: Photodetector
SOA: Semiconductor Optical Amplifier
C: Circulator
FC1, . . . , FC7: Optical fiber coupler
MLFL: Mode-Locked Fiber Laser
PC1, PC2, PC3: Polarization Controller
PG: Pulse Generator
VD1, VD2, VD3: Variable Delay

DETAILED DESCRIPTION OF THE EMBODIMENTS

Hereinafter, preferred embodiments of the present invention will be described in detail with reference to the accompanying drawings.

Figure 1:
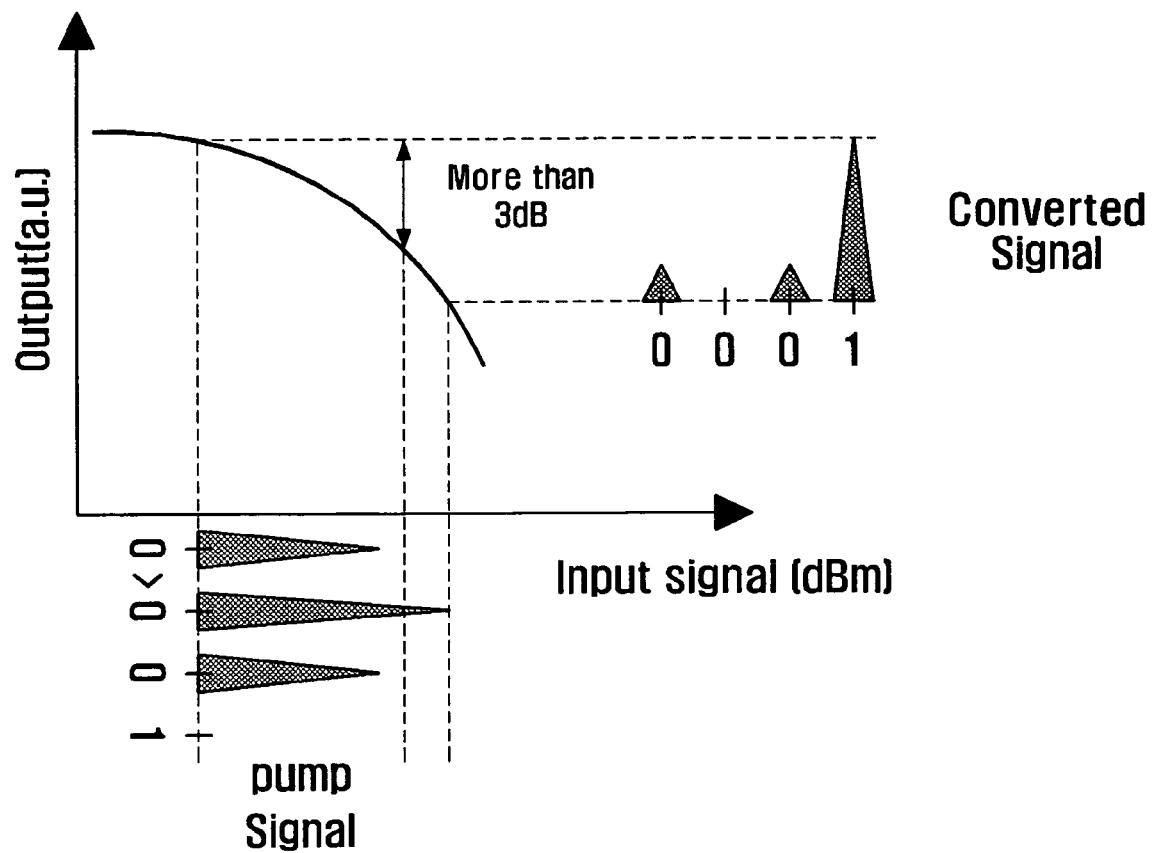
FIG. 1 is a conceptual diagram which shows the operational principle of an all-optical NOR logic device.

FIG. 1 is a conceptual diagram which shows the operational principle of an all-optical NOR logic device.

According to the present invention, the probe signal and pump signal are generated in return-to-zero (RZ) pattern signals in order to improve the operating speed.

If a pump signal with a high power is coupled into a semiconductor optical amplifier (SOA), carrier depletion occurs in the SOA.

Accordingly, since a probe signal in a pulse form with a fixed period is outputted after identically modulated to the gain modulation through carrier depletion within the SOA, the output signal has an opposite logic to the pump signal.

However, since the On-Off difference of the pulses is large when the pulse signal is used, the size of the output signal when the pulse signal is not present is small enough to be considered as 0.

Accordingly, when there is the pulse signals in the probe signal, the output signal becomes 0 irrespective of the pump signal.

Figures 2A, 2B:
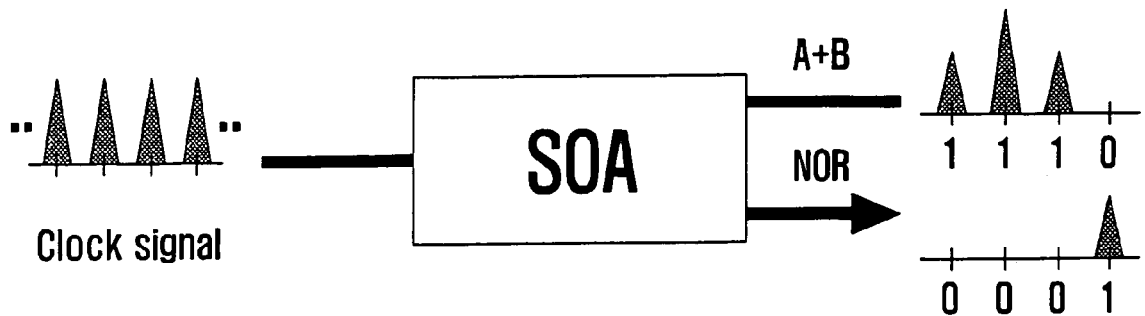
FIG. 2a and FIG. 2b are a basic construction diagram and a truth table of an all-optical NOR logic device.

FIGS. 2a and 2b are a basic configuration diagram and a truth table of the all-optical NOR logic device, respectively.

If it is assumed that the state is ON if there is a pulse and the state is OFF if there is no pulse, then when the pump signal is in OFF state, the probe signal passes through the SOA and the output signal is in ON state.

Accordingly, a Boolean equation $\overline{A+B}$, which is a NOR value of A and B signals, is obtained after coupling together A and B signals and inputting the coupled signal to the SOA, along with a clock signal, simultaneously from the opposite direction as shown in FIG. 2a.

Since it coincides with the Boolean values in the truth table of the NOR logic device, this result implies that an all-optical NOR logic device could be implemented by only one SOA.

Figure 3:
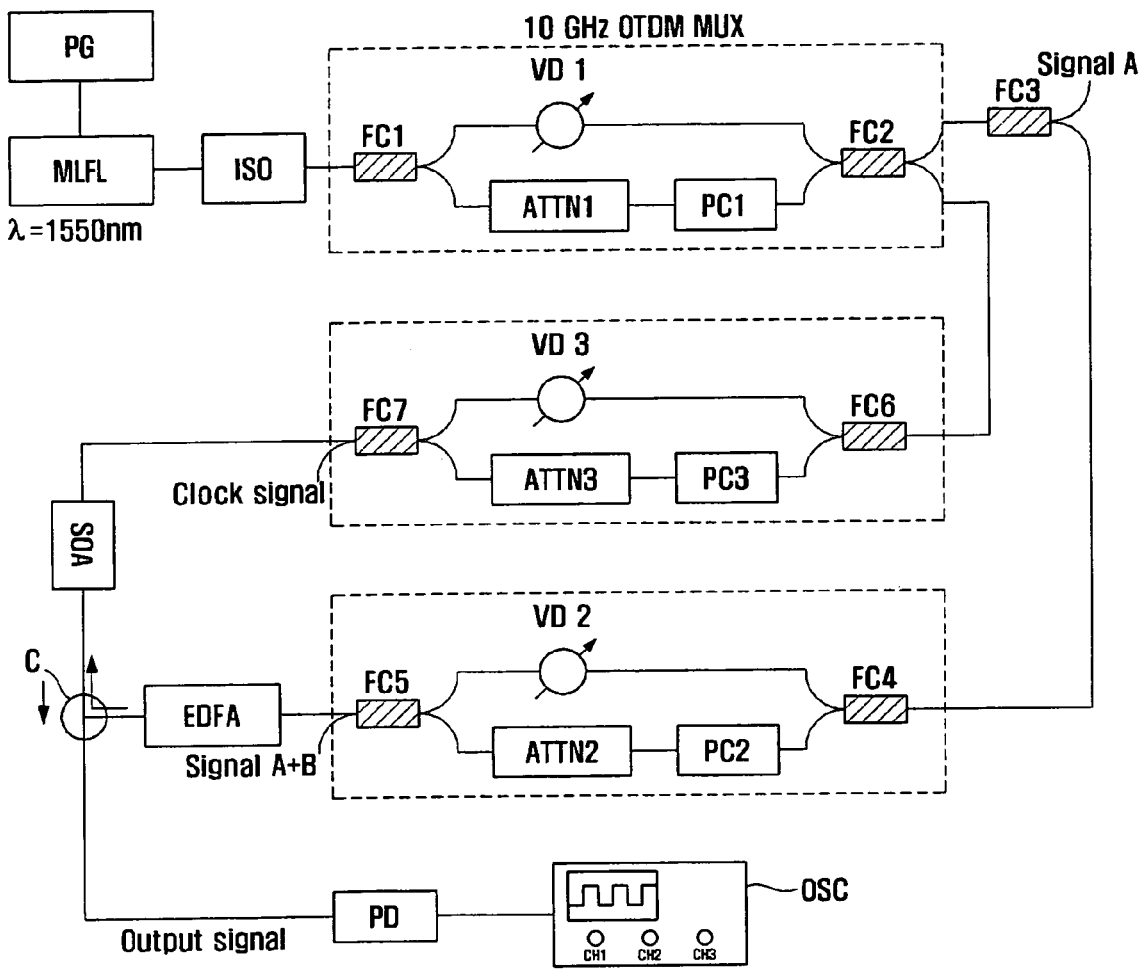
FIG. 3 is a schematic diagram of apparatus for realizing the all-optical NOR logic device according to the present invention.

FIG. 3 a schematic diagram of the apparatus for realizing an all-optical NOR logic device.

The input signal patterns A and B of the all-optical NOR logic device are made of Mode-Locked Fiber Laser (MLFL) with a wavelength of 1550 nm.

The MLFL operates at 2.5 GHz with a period of 400 ps through a pulse generator (PG).

The width of the pulses generated at this instance is around 38 ps.

The output of the MLFL after being splited by the first 50:50 fiber coupler (FC1), passes through a delay means of Variable Delay (VD1), control means of Attenuator (ATTN1) and Polarization Controller (PC1) in order to obtain a time delay of 100 ps, and then is coupled to form an input signal pattern A (1100) which operates at 10 Gbits/s through the second 50:50 fiber coupler (FC2).

The upper side optical fiber of the output terminal of the second 50:50 fiber coupler (FC2) is splitted by the fourth 50:50 fiber coupler (FC4).

In order to obtain a time delay of 100 ps, the incident light (1100) of the upper side optical fiber passes through a delay means of Variable Delay (VD2) generating an input signal pattern B (0110) and the incident light (1100) of the lower side optical fiber passes through an Attenuator (ATTN2) and Polarization Controller (PC2).

The output light (B) of the upper side optical fiber and the output light (A) of the lower side optical fiber are coupled at the fifth 50:50 fiber coupler (FC5), generating A+B (1110) which is the sum of the pattern A and B.

In the mean time, a clock signal pattern (1111) is generated through the incident light (1100) of the upper side optical fiber which passes through a Variable Delay (VD3) in order to obtain a time delay of 200 ps, and the incident light (1100) of the lower side optical fiber passes through an Attenuator (ATTN3) and Polarization Controller (PC3) in order to be coupled at the seventh 50:50 fiber coupler (FC7) after the input signal pattern A(1100) which is coupled with the lower side optical fiber of the second 50:50 fiber coupler (FC2) is splited at the sixth 50:50 fiber coupler (FC6).

The pump signal pattern A+B (1110) of the upper side optical fiber of the output terminal of the fifth 50:50 fiber coupler (FC5) is coupled into the SOA in the opposite direction to the probe signal pattern of the upper side optical fiber of the output terminal of the seventh 50:50 fiber coupler (FC7) after being amplified by an Er-doped fiber amplifier (EDFA) and passing through an optical circulator (C).

If the probe signal and the pump signal of different wavelengths is coupled into the SOA from the same direction, an optical filter is necessary in order to extract the probe signal. (Young Tae Byun, Jae Hun Kim, Young Min Jeon, Seok, Deok Ha Woo, and Sun Ho Kim, "An-Optical OR Gate by using cascade SOAs," 2002 International Topical meeting on Photonics in Switching, Hyatt Regency (Cheju Island, Korea), 187(2002)).

However, if two signals above were to be incident upon the SOA from the opposite direction, the optical filter is not necessary even though the wavelengths of the probe signal and pump signal are the same.

At this instance, a Boolean equation $\overline{A+B}$, which has the logic pattern (0001) due to the inversely modulated gain by A+B signal, is obtained by the gain saturation characteristics of the SOA.

Although the wavelengths of the probe signal and pump signal are the same in the preferred embodiment of the present invention, the same method could be applied in order to obtain the operation of an all-optical NOR logic device when the wavelengths are different.

The unelaborated symbols on the parts of the drawing including ISO, PD and OSC respectively mean an Isolator, Photodetector and Oscilloscope.

Figure 4:
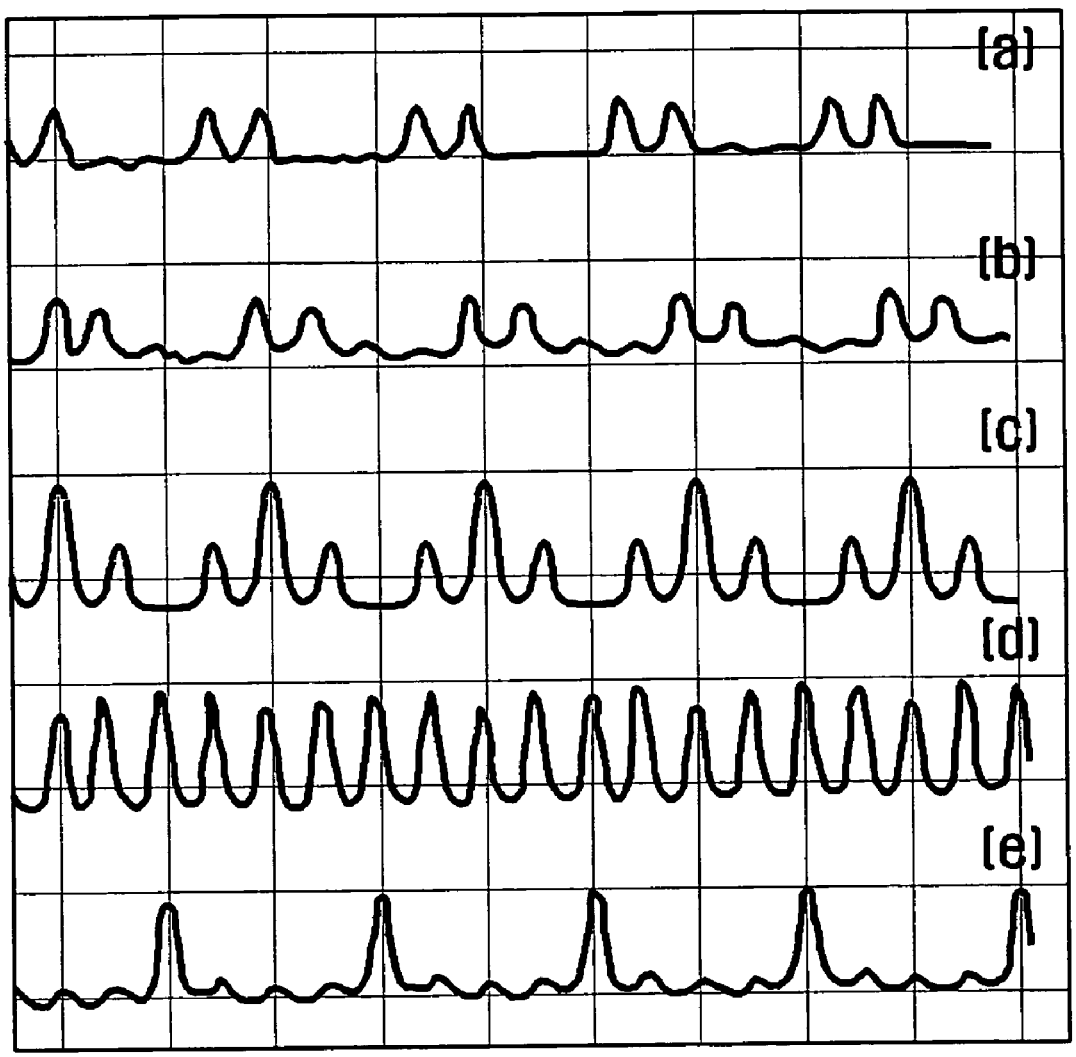
FIG. 4 is a diagram depicting the characteristics of the all-optical NOR logic device which is operating at 10 Gbit/s according to the present invention.

FIG. 4 is a diagram depicting the characteristics of an all-optical NOR logic device which is operating at 10 Gbit/s.

FIG. 4*a* shows an input signal pattern A, which has a 1100 pattern measured at the third 50:50 fiber coupler (FC3).

FIG. 4*b* shows an input signal pattern B, which has a 0110 pattern measured at the fifth 50:50 fiber coupler (FC5).

FIG. 4*c* shows an input signal pattern A+B, which is measured at the lower optical fiber of the output terminal of the fifth 50:50 fiber coupler (FC5).

FIG. 4*d* shows a clock signal pattern, which is measured at the lower optical fiber of the output terminal of the seventh 50:50 fiber coupler (FC7).

FIG. 4*e* shows an output waveform generated when the signal A+B with the pattern (1110) passes through the SOA in the opposite direction to a clock signal pattern (1111) which is a probe signal.

In this case, there is no output light when the logic signals are (1, 0), (1, 1), (0, 1) and the output light only exists when the logic signal is (0, 0).

Hence, when the light intensity of the probe signal and the pump signal become 0.3 dBm and 10.8 dBm, respectively, the operating characteristics of the all-optical NOR logic device is realized.

The previously mentioned optical signals were measured by a 45 GHz photodetector and sampling oscilloscope.

According to the present invention as described so far, the pump signal pattern A+B with the four logic signals [(1,0), (1,1), (0,1), (0,0)] are obtained by coupling two input signal patterns A(1100) and B(0110) with the same wavelengths. In addition, a clock signal (1111), which is the probe signal, is obtained by the sum of input signal pattern A(1100) and another input signal pattern (0011), which is a new pattern that signal A is delayed for 200 ps.

When the pump signal and probe signal pass through the SOA in the opposite direction, a 10 Gbit/s all-optical NOR logic device is successfully realized through the gain saturation characteristics of the SOA.

More specifically, when both signal A and B are logic 0, output signal becomes logic 1, otherwise all output signals become logic 0.

Since these results coincide with the Boolean NOR truth table, the all-optical NOR logic device according to the present invention is experimentally proved.

According to the present invention, the complicated optical circuits in optical computers and all-optical signal processing systems could easily be realized.

All-optical NOR logic devices, along with single logic devices(AND, OR, XOR, NAND, NXOR) are essential building blocks in the construction of optical computers and all-optical signal processing systems.

NOR is also an essential device for an all-optical full adder which is the basis of all logical calculation.

Specifically, the all-optical logic device according to the present invention has a simple construction since it is realized through the XGM (Cross Gain Modulation) method which utilizes the gain saturation characteristics. Also, it is expected that the method employed in the present invention could be used for realizing other all-optical logic circuits and devices.

Hence, if an efficient method for integrating all-optical logic devices were developed, controlling all systems only through optical signals will become feasible without the use of electric signals.

What is claimed is:

1. A method for realizing an all-optical NOR logic device using the gain saturation characteristics of a semiconductor optical amplifier(SOA), comprising the steps of:
   utilizing A+B signal which couples together an input signal pattern A (1100) and an input signal pattern B (0110) as a pump signal (1110);
   utilizing a probe signal (1111) by generating a clock signal out of said input signal pattern A (1100); and
   outputting an optical signal equivalent to the boolean expression $\overline{A+B}$ by making said probe signal and said pump signal to be incident upon the SOA simultaneously from the opposite direction.

2. The method according to claim 1, wherein said pump signal generates an input signal pattern A (1100) by multiplexing the modulated waveform of a Mode-Locked optical fiber laser, and generates an input signal pattern B (0110) by time delaying said input signal pattern A (1100), and generates a coupled two input signal pattern A+B using a optical fiber coupler.

3. The method according to claim 2, wherein said Mode-Locked optical fiber laser operates at 2.5 GHz with a wavelength of 1550 nm and then the laser beam is multiplexed at 10 Gbit/s.

4. The method according to claim 2, wherein the time delay of said input signal pattern A (1100) is 100 ps.

5. The method according to claim 1, wherein said probe signal is a clock signal (1111) which is obtained by the delayed signal added with signal A (1100) after time delay applied to 1100 pulse train.

6. The method according to claim 5, wherein the time delay of said input signal pattern A (1100) is 200 ps.

7. The method according to claim 1, wherein both said probe signal and pump signal is incident upon the SOA in a pulse form in order to realize NOR logic device using the Cross Gain Modulation (XGM) method.

8. The method in any one of claims 1, 2 or 5, wherein the wavelengths of said probe signal and pump signal are different.

9. An apparatus for realizing an all-optical NOR logic device using the gain saturation characteristics of a semiconductor optical amplifier SOA, comprising:
   a pump signal generating means which generates a coupled input signal A+B to be used as a pump signal (1110) through a coupling of an input signal pattern A (1100) and an input signal pattern B (0110);
   a probe signal generating means which generates a clock signal out of said input signal pattern A (1100) to be used as a probe signal (1111); and
   a NOR generating means which obtains a Boolean expression $\overline{A+B}$ by making said probe signal and pump signal incident upon the SOA simultaneously from the opposite direction.

10. The apparatus according to claim 9, wherein said pump signal generating means further comprising:
- a pattern A realizing means which generates an input signal pattern (1100) by multiplexing the modulated waveform of a Mode-Locked optical fiber laser (MLFL);
- a pattern B realizing means which generates an input signal pattern (0110) by time delaying said input signal pattern A (1100); and
- a pattern A+B realizing means which generates a coupled two input signal A+B by utilizing the fifth optical fiber coupler.

11. The apparatus according to claim 10, wherein said pattern A realizing means further comprising:
- a Mode-Locked optical fiber laser which is operated by a pulse generator and outputs light with a fixed wavelength;
- a first optical fiber coupler which splits the light output of said Mode-Locked optical fiber laser;
- a first variable delay which delays one side of the light output that is splited by the first optical fiber coupler;
- a first attenuator and a first polarization controller which control the other side of the light output that is splited by said first optical fiber coupler; and
- a second optical fiber coupler which couples said delayed light output and controlled light output.

12. The apparatus according to claim 11, wherein said pattern B realizing means further comprising:
- a fourth optical fiber coupler which splits the output of a third optical fiber coupler which is coupled to said second optical fiber coupler;
- a second variable delay which delays one side of the light output that is splited by the fourth optical fiber coupler; and
- a second attenuator and a second polarization controller which control the other side of the light output that is splited by said fourth optical fiber coupler.

13. The apparatus according to claim 9, wherein said probe signal generating means further comprising:
- a sixth optical fiber coupler which splits the output of said input signal pattern A (1100);
- the third variable delay which delays one side of the light output that is splited by the sixth optical fiber coupler; and
- a third attenuator and a third polarization controller which control the other side of the light output that is splited by said sixth optical fiber coupler; and
- a seventh optical fiber coupler which couples said delayed light output and controlled light output.

14. The apparatus according to claim 9, wherein said NOR generating means further comprising:
- an Er-doped fiber amplifier (EDFA) which amplifies said pump signal;
- an optical circulator which injects said amplified pump signal into one side of a semiconductor optical amplifier SOA; and
- a SOA in which a Boolean logic equation $\overline{A+B}$, which has the pattern of 0001, is obtained according to the gain saturation characteristics of the SOA.

* * * * *